US008203369B2

United States Patent
van de Beek

(10) Patent No.: US 8,203,369 B2
(45) Date of Patent: Jun. 19, 2012

(54) FAST-LOCKING BANG-BANG PLL WITH LOW OUPUT JITTER

(75) Inventor: Remco Cornelis Herman van de Beek, Eindhoven (NL)

(73) Assignee: NXP B.V., Eindhoven (NL)

( * ) Notice: Subject to any disclaimer, the term of this patent is extended or adjusted under 35 U.S.C. 154(b) by 68 days.

(21) Appl. No.: 12/999,596

(22) PCT Filed: Jun. 11, 2009

(86) PCT No.: PCT/IB2009/052499
  § 371 (c)(1),
  (2), (4) Date: Dec. 16, 2010

(87) PCT Pub. No.: WO2009/153716
  PCT Pub. Date: Dec. 23, 2009

(65) Prior Publication Data
  US 2011/0084741 A1    Apr. 14, 2011

(30) Foreign Application Priority Data
  Jun. 17, 2008   (EP) ...................................... 08158395

(51) Int. Cl.
  *H03L 7/06* (2006.01)
(52) U.S. Cl. ........................................ 327/156; 327/147
(58) Field of Classification Search .................. None
  See application file for complete search history.

(56) References Cited

U.S. PATENT DOCUMENTS

| | | | |
|---|---|---|---|
| 4,827,225 A | 5/1989 | Lee | |
| 4,926,141 A | 5/1990 | Herold et al. | |
| 5,268,652 A | 12/1993 | Lafon | |
| 5,757,868 A * | 5/1998 | Kelton et al. | 375/360 |
| 5,832,048 A | 11/1998 | Woodman, Jr. | |
| 6,473,478 B1 | 10/2002 | Wallberg et al. | |
| 7,053,719 B2 * | 5/2006 | Steinbach et al. | 331/16 |
| 2006/0091969 A1 * | 5/2006 | Kenney et al. | 331/167 |

FOREIGN PATENT DOCUMENTS

| | | |
|---|---|---|
| WO | 2005/078935 A1 | 8/2005 |
| WO | 2010/020911 A1 | 2/2010 |

OTHER PUBLICATIONS

Staszewski, B., et al, "All-Digital Phase-Domain TX Frequency Synthesizer for Bluetooth Radios in 0.13 μm CMOS", IEEE Intl. Solid-State Circuits Conf. Dig. Tech. Papers, vol. 527, No. 15.3, 10 pgs. (Feb. 2004).

International Search Report and Written Opinion for Int'l. patent appln. No. PCT/IB2009/052499 (Dec. 16, 2009).

* cited by examiner

*Primary Examiner* — Cassandra Cox

(57) ABSTRACT

The present invention relates to a gigitaol phaselocked loop DPLL (300, 400) having a phase-to-digital P2D (60) with an enhanced bang-bang phase detector BBPD. Such a P2D (60) comprises a BBPD (62), an additional digital circuit (200) including a sign detector (210), a counter (220) and a mapping function (230), and a summer block (64). During the locking process, the BBPD (62) may-output a repeating value, namely a string of data bits of same polarity value either "+1" or "−1". The polarity sign is detected by the sign detector (210), and the data string length is determined by the counter (220) that is reset to zero whenever the BBPD output changes sign. The mapping function (230) is configured for mapping the data string length in input to the phase correction level in output Its output is added to that of the BBPD (62) through the summer block (64), such that the phase correction level is increased to enhance the locking process whenever a data string is detected.

15 Claims, 11 Drawing Sheets

FAST-LOCKING BANG-BANG PLL WITH LOW OUPUT JITTER

FIELD OF THE INVENTION

The present invention relates to the field of phase-locked loops, and more particularly to digital phase-locked loops with a bang-bang phase detector.

BACKGROUND OF THE INVENTION

Since the first phase-locked loop (PLL) designed in the 1930s for use in radio receivers, the phase locking concept has been applied to many applications ranging from generating clock signals in microprocessors to synthesizing frequencies. A conventional analog PLL is basically an oscillator whose frequency is locked onto some frequency component of an input signal. In the forward path, a phase detector (PD) compares the phase of the input signal to the phase of an output signal, and generates an output that is proportional to the phase difference. The output of the PD is filtered by an analog loop filter and then used to control the frequency of a voltage-controlled oscillator (VCO). An optional divider can be used in the feedback path for frequency multiplication. Through the negative feedback, the PLL corrects any phase misalignment resulting from the internal or external noise sources for being in phase lock when the input and output phases are aligned.

Due to several advantages in comparison to its analog counterpart, such as a relatively low cost, an easy scalability with process shrink, a faster design turnaround, an inherent noise immunity of digital circuits, an enhanced oscillator phase noise performance, a lower susceptibility to process, voltage, temperature (PVT) variations, and a faster lock speed by preloading the oscillator control input, the current design trend is towards replacing such an analog PLL by a digital PLL (DPLL). As depicted in FIG. 1, the DPLL 100 typically consists of a phase-to-digital converter (P2D) 60, a digital loop filter (DLF) 70, a digitally controlled oscillator (DCO) 80, and a feedback device 10. The feedback device 10 can be any device able to guarantee locking of the output frequency Fout of the DCO 80 onto the correct multiple of the reference frequency Fref of an input signal. Thus, Fout=N*Fref if the feedback device 10 is, for example, a divide-by-N frequency divider. As illustratively represented in FIG. 1, the DLF 70 may be formed of a proportional control path comprising a proportional gain block 20 for a better loop stability (damping), an integral control path comprising an integrator block 30 followed by an integral gain block 40, and a summer block 50 allowing the output of the proportional gain block 20 to be added to that of the integral gain block 40, the resulting output being input to the DCO 80.

Thus, the P2D 60 acts as a digital PD (DPD) that senses the phase difference between the reference frequency Fref and the DCO divided output frequency Ffbck, and converts it into a digital value to indicate the amount of phase error ε it sees at its input. This information is filtered by the DLF 70 and is then used to control the DCO 80.

The P2D 60 can be implemented in several different ways.

In particular and in order to keep the design as simple as possible, the P2D 60 can be a 1-bit phase digitizer or detector, which samples Fref with Ffbck or vice versa using a single flip-flop, e.g. a D-type flip-flop, and allows to determine the sign of the phase error. This 1-bit phase digitizer is called a bang-bang phase detector (BBPD), also referred to as a binary or up/down PD, and can be used as long as an integer-N DPLL is needed, namely as long as all output frequencies Fout are an integer multiple of the reference frequency Fref. However, the BBPD has the disadvantage, in comparison to an analog PD, to give information only on the mathematical sign or polarity of the phase error rather than on the signed magnitude. Thus, the BBPD suffers from a jitter versus frequency tracking range trade-off, such that a trade-off must be found between output jitter in the time domain (or phase noise in the frequency domain), and DPLL lock time. Indeed, a small response to the BBPD output leads to low output jitter, but also causes long DPLL lock times. Reversely, fast locking by strongly responding to the BBPD output causes high jitter when in phase lock.

Assumed that the DPLL 100 of FIG. 1 has an extra lock speed enhancement in the form of pre-loading the value of its integrator block 30, then the DCO frequency will be right away close to the wanted frequency, even if a little off due to its own quantization step and possibly a voltage and temperature drift may occur. But apart from being slightly off in frequency, there is still no guarantee for phase lock at all, since the phase may be off by as much as 180 degrees. Achieving phase lock may still take much time, especially when the reaction of the DPLL 100 to a measured phase error is small in order to obey the jitter (phase noise) specification for example. The main reason for this is that the DPLL 100 of FIG. 1 has no knowledge of the magnitude of the phase error, while only controlling the same amount as the one set by the jitter (phase noise) specification after achieving phase lock.

Alternatively, the P2D 60 can be a more linear DPD, like a time-to-digital converter (TDC), for performing a linear phase digitizing by measuring the time difference between the rising edges of frequencies Fref and Ffbck. If the DPLL 100 has information on the magnitude of the phase error, it can correct accordingly, namely make larger corrections for larger phase errors. However, the major drawback of the TDC is its inherent design, which is far more complex than the BBPD design.

SUMMARY OF THE INVENTION

It is therefore an object of the present invention to provide a simple and fast-locking bang-bang PLL with low output jitter, namely to provide a simple digital PLL able to achieve fast lock times while improving jitter (phase noise) performance in lock.

This object is achieved by a circuit as claimed in claim 1, a phase-locked loop as claimed in claim 11, a method as claimed in claim 12, a computer program as claimed in claim 13, and an integrated circuit as claimed in claims 14 and 15.

In accordance with the present invention, there is provided a circuit for enhancing a phase-locking process, the circuit comprising:

a single-bit phase detector for providing a single-bit data in output, the single-bit data being defined by a polarity;

a sign detector for detecting a sign of the polarity, the sign detector providing a reset signal whenever the detected sign changes;

a counter for measuring a count value corresponding to a number of consecutive single-bit data provided by the single-bit phase detector, the counter being reset to zero after receiving the reset signal;

a mapping function for performing an input-output mapping, the mapping function being configured for mapping the count value in input to a reaction level of the circuit in output, the reaction level corresponding to a phase correction level; and a summer block for summing the output of the mapping function and the output of the single-bit phase detector.

Thereby, the circuit can detect a repeating value or string of single-bit data of same polarity, and increase its output magnitude based on the reaction level in a significantly faster manner than with a circuit comprising only a single-bit phase detector.

The single-bit phase detector may be a bang-bang phase detector. Thereby, the design of the circuit can be kept as simple as possible.

The circuit may have one output, which corresponds to the output of the summer block.

The circuit may also have a first output and a second output, the first one corresponding to the output of the summer block and the second one corresponding to the output of the single-bit phase detector.

Furthermore, several embodiments of the sign detector may be proposed.

According to a first embodiment, the sign detector may comprise a delay element for delaying the output of the single-bit phase detector by one reference clock period, and a first comparator for comparing the delayed output and the output of the single-bit phase detector, the first comparator providing the reset signal as a comparison result whenever a difference between the delayed output and the output of the single-bit phase detector is detected.

According to a second embodiment, the sign detector may comprise a sign indicator for indicating a sign of the count value, and a second comparator for comparing a sign of the output of the single-bit phase detector and the indicated sign, the second comparator providing the reset signal as a comparison result whenever a difference between the sign of the output of the single-bit phase detector and the indicated sign is detected.

According to a third embodiment, the sign detector may comprise a multiplier for generating a mathematical product of the output of the single-bit phase detector with the count value, and a third comparator for determining whether the mathematical product is less than zero, the third comparator providing the reset signal if the response is affirmative.

As a variant to the third embodiment, the sign detector may comprise a multiplier for generating a mathematical product of the output of the single-bit phase detector with the count value, and a fourth comparator for determining whether the mathematical product is less than or equal to zero, the fourth comparator providing the reset signal if the response is affirmative.

Moreover, the mapping may be made by setting a threshold of the count value, the threshold defining a dead zone corresponding to a zero value of the reaction level. Thereby, only the repeating value or string of single-bit data of same polarity greater in absolute value than the threshold can lead to a non-zero reaction level, which prevents any jitter (phase noise) from increasing once lock has been achieved, since short strings can still occur in that case.

Additionally, the mapping may be made by setting a maximum value of the reaction level. Thereby, the reaction level can be limited during phase-locking process for avoiding entering unstable regions.

The present invention further extends to a phase-locked loop.

In accordance with the present invention, there is provided a method of enhancing a phase-locking process, the method comprising the steps of:

providing a single-bit data, the single-bit data being defined by a polarity;

detecting a sign of the polarity;

providing a reset signal whenever the detected sign changes;

measuring a count value corresponding to a number of consecutive provided single-bit data, the count value being reset to zero after receiving the reset signal;

performing an input-output mapping by mapping the count value in input to a reaction level, the reaction level corresponding to a phase correction level; and summing the reaction level and the single-bit data.

The steps of the previous method can be carried out by a computer program comprising program code means when said computer program is carried out on a computer.

The present invention further extends to an integrated circuit comprising either the preceding circuit or the preceding phase-locked loop.

BRIEF DESCRIPTION OF THE DRAWINGS

These and other aspects and advantages of the present invention will be apparent from and elucidated with reference to the embodiment(s) described hereinafter. In the following drawings.

DETAILED DESCRIPTION OF EMBODIMENTS

Figure 2:
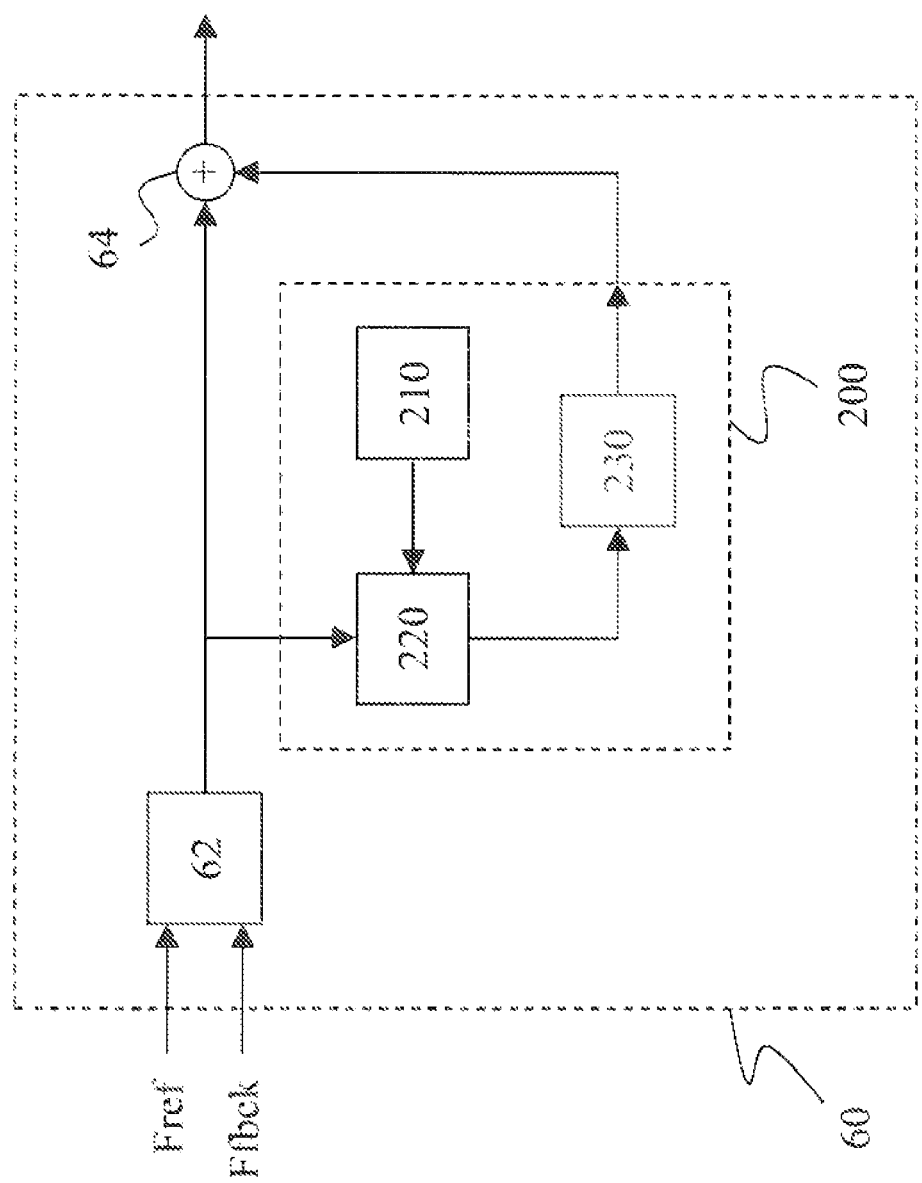
FIG. 2 shows a block diagram of a P2D with an enhanced BBPD according to an embodiment of the present invention.

FIG. 2 shows a P2D 60 having an enhanced BBPD according to an embodiment of the present invention. Such a P2D 60 comprises a stand-alone BBPD 62, an additional digital circuit 200 including a sign detector 210, a counter 220 and a mapping function 230, and a summer block 64.

In order to have a configuration as simple as possible, the BBPD 62, which is also a single-bit phase digitizer or single-bit phase detector, may be implemented by a single flip-flop for example. During the phase-locking process, it detects a phase difference at its input and outputs a digital value indicating the amount of phase error $\epsilon$ it sees at its input. The digital value is in the form of data bits of value either "+1" or "−1" depending on the sign "+" or "−" of the detected phase difference, which sign change may occur at the zero-crossing at phase zero-degree or 180-degrees. This polarity sign "+" or "−" is detected by the sign detector 210, which provides the counter 220 with a reset signal whenever a sign change is detected. The counter 220 is basically an up-down counter that performs an up-counting when the polarity of a data bit is positive (+), and a down-counting when the polarity of a data bit is negative (−). Thus, the counter 220 counts the number of consecutive data bits of same polarity forming a data string, namely the number of consecutive +1's or −1's, thereby measuring in output a count value, either positive if up-counting or negative if down-counting, indicating the data string length. The output of the counter 220 is reset to zero (0), through the reset signal output by the sign detector 210, each time the BBPD output changes sign. The data string length provided by the counter 220 is then input into a mapping function 230, which performs a simple input-output mapping while being configured for mapping the data string length (input characteristic on axis of abscissa) to the phase correction level, namely to the reaction level of the P2D 60 (output characteristic on axis of ordinates).

Mapping may be made by introducing an optional threshold of the count value, e.g. a value DZ defining a dead zone (+/−DZ) ranging between −DZ and +DZ on the axis of abscissa, which ensures that only the data strings longer in absolute value than the threshold DZ lead to an increased phase correction level. Thus, the introduction of this threshold will prevent any jitter (phase noise) from increasing once lock has been achieved, since short strings or repetitions of the BBPD output can still occur in that case, such that these short strings should not make the DPLL 300, 400 using such an enhanced BBPD respond differently with respect to a DPLL only using a stand-alone BBPD 62. In other terms, the P2D 60 behaves as the stand-alone BBPD 62 once lock has been reached.

Furthermore, mapping may be made by setting an optional maximum value of the phase correction level, e.g. a value C corresponding to a clipping value (+/−C) on the axis of ordinates, which limits the reaction of the P2D 60, and so the reaction of the DPLL 300, 400, during locking and thereby ensures that the DPLL 300, 400 does not enter unstable regions.

Alternatively, mapping may be made by combining the dead zone and the clipping value.

Figure 3A:
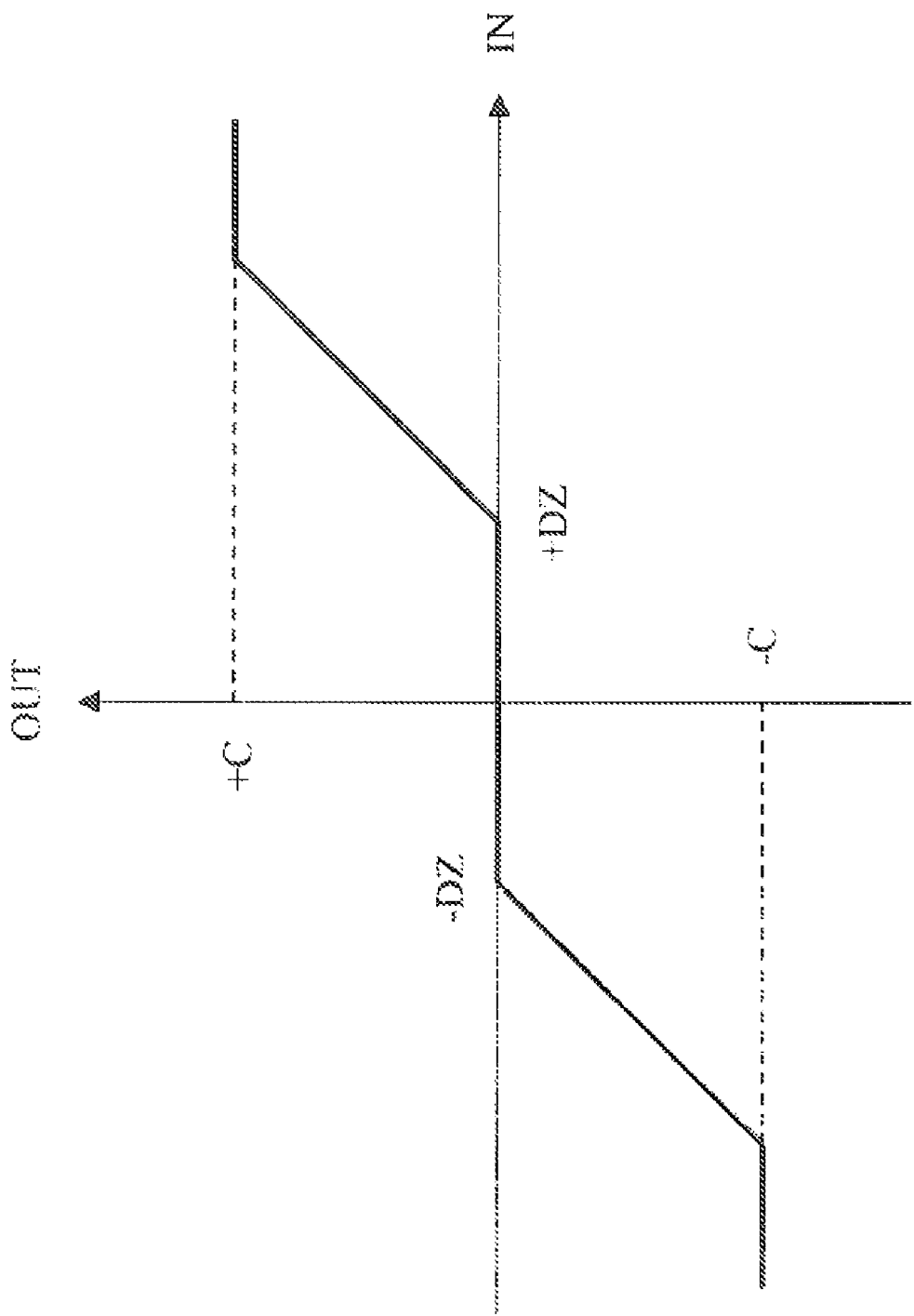
FIG. 3a shows a diagram that illustrates the input-output characteristic of a mapping function combining a dead zone (+/−DZ) and a clipping value (+/−C), in the case that the gain is unity in the sloped part.
Figure 3B:
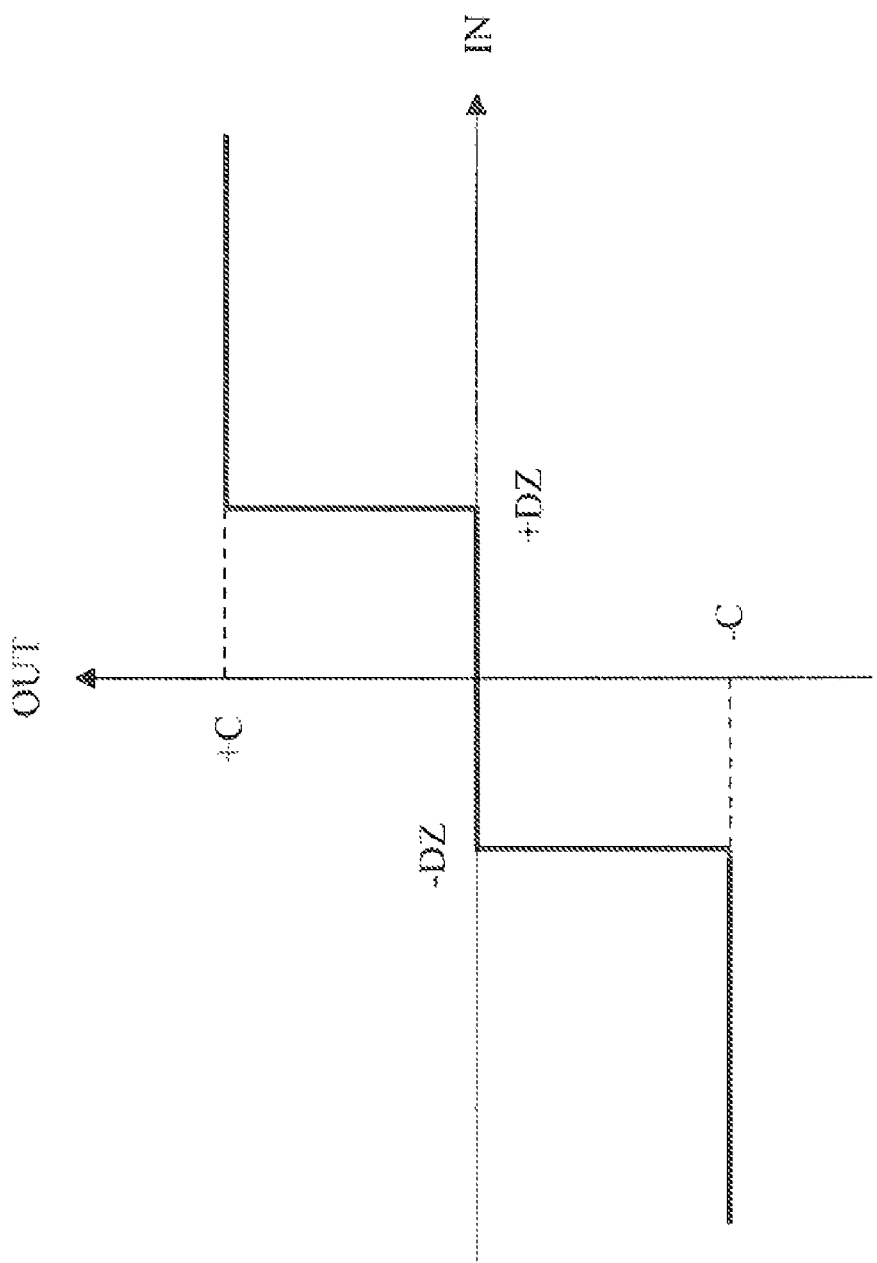
FIG. 3b shows a diagram that illustrates the input-output characteristic of the mapping function combining a dead zone (+/−DZ) and a clipping value (+/−C), in the case that the gain is discontinuous at +DZ and −DZ values.

Additionally, the mapping function 230 may exhibit several transfer characteristics. As an exemplary illustration, FIGS. 3a and 3b show the input-output characteristics of a mapping function 230 combining the dead zone (+/−DZ) and the clipping value (+/−C), in the case that the transfer curve has respectively a unity gain in the sloped part and a discontinuous gain at +DZ and −DZ values. By comparison with the former case, the latter case shows that the phase correction level after exceeding the dead zone changes in a more radical way.

Finally, the output of the additional digital circuit 200, which also corresponds to the output of the mapping function 230, is added to that of the BBPD 62 through the summer block 64, such that the phase correction level is increased to enhance the phase-locking process if a data string is detected. If the mapping function 230 exhibits the aforementioned threshold DZ, then the phase correction level will be increased in the case of data strings longer in absolute value than DZ.

Several embodiments of the additional digital circuit 200 in the P2D 60 of FIG. 2 may be proposed. In the following, some of them are given only for illustration.

Figure 4A:
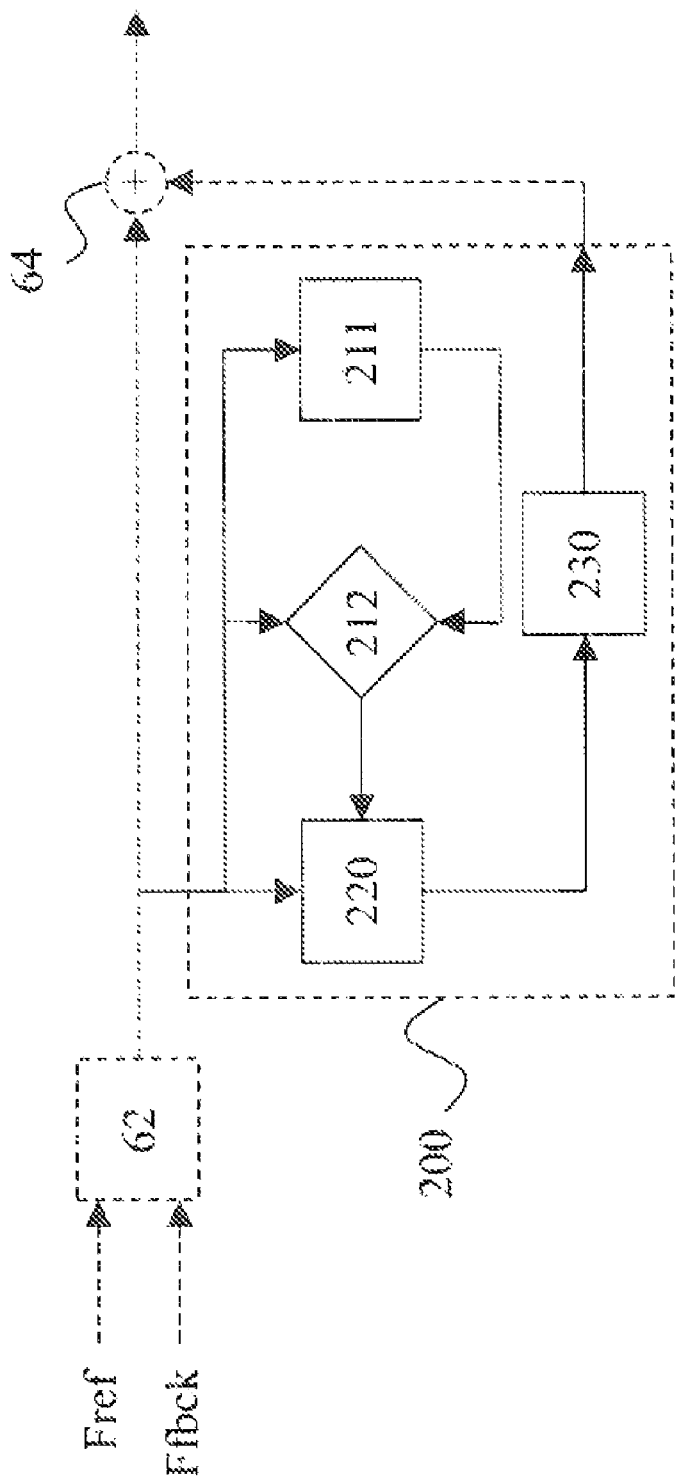
FIG. 4a shows a block diagram of the additional digital circuit in the P2D of FIG. 2, according to a first embodiment.

As depicted in FIG. 4a corresponding to the first embodiment, the sign detector 210 of FIG. 2 may be comprised of a delay element 211 and a comparator 212. In this case, the sign change at the BBPD output can be detected by the delay element 211, which delays the BBPD output by one reference clock period, together with the comparator 212, which compares the BBPD output and the delayed BBPD output and delivers the reset signal as a comparison result when a difference between those both outputs is detected.

Figure 4B:
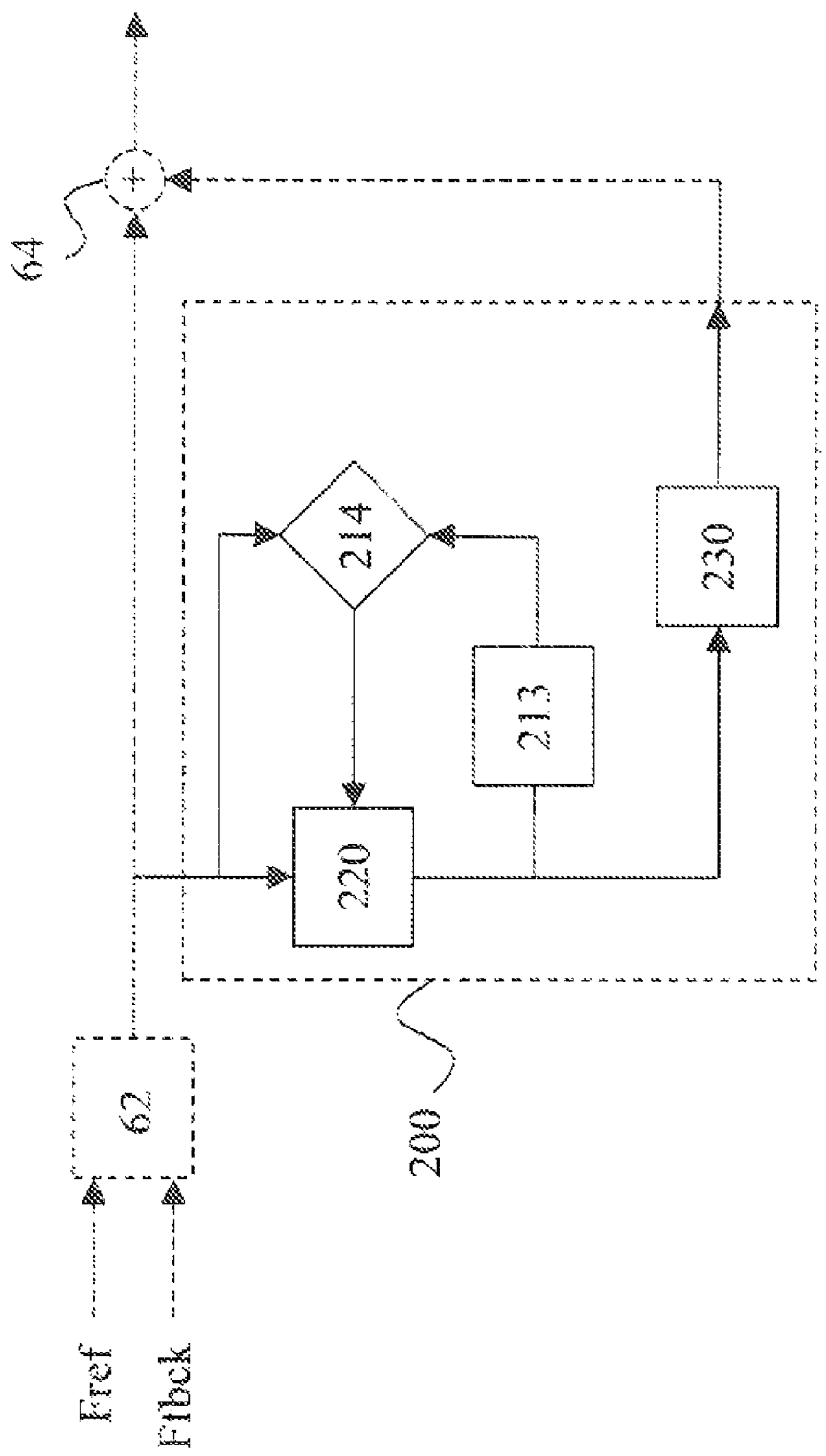
FIG. 4b shows a block diagram of the additional digital circuit in the P2D of FIG. 2, according to a second embodiment.

As depicted in FIG. 4b corresponding to the second embodiment, the sign detector 210 of FIG. 2 may be comprised of a sign indicator 213 and a comparator 214. In this case, the sign change at the BBPD output can be detected by the sign indicator 213, which indicates the sign + or − of the count value output by the counter 220, together with the comparator 214, which compares the sign of the BBPD output with the sign of the count value and delivers the reset signal as a comparison result when a sign difference is detected.

Figure 4C:
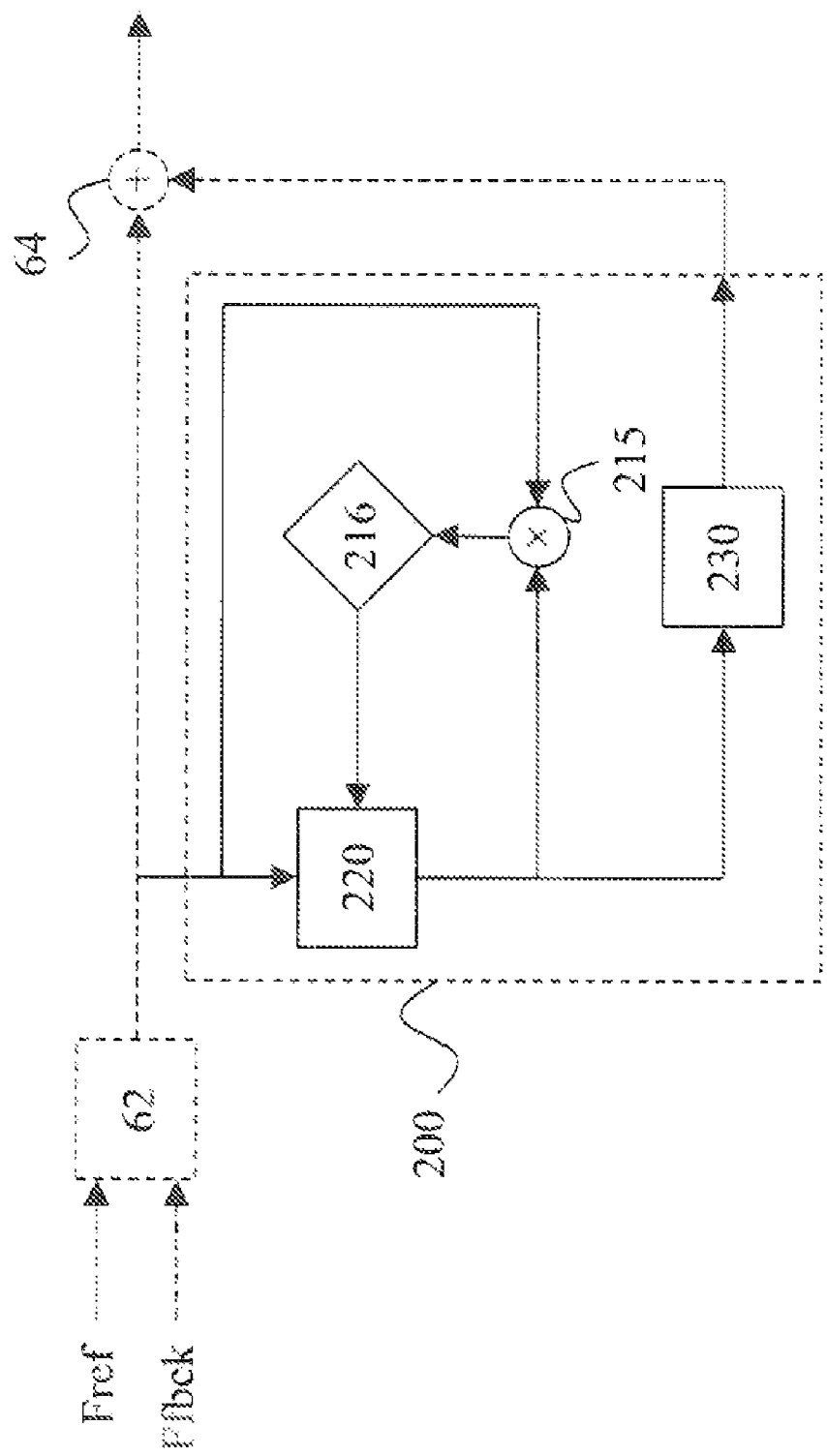
FIG. 4c shows a block diagram of the additional digital circuit in the P2D of FIG. 2, according to a third embodiment.

As depicted in FIG. 4c corresponding to the third embodiment, the sign detector 210 of FIG. 2 may be comprised of a multiplier 215 and a comparator 216. In this case, the sign change at the BBPD output can be detected by the multiplier 215, which generates the mathematical product of the BBPD output with the count value, together with the comparator 216, which is configured to determine whether this mathematical product is less than zero (i.e. <0) and to deliver the reset signal if the response is affirmative, namely if the mathematical product is strictly negative.

As a variant to the third embodiment of FIG. 4c for detecting the sign change at the BBPD output, the comparator 216 may be replaced with another comparator 217 (not represented), which is configured to determine whether the mathematical product of the BBPD output and the count value is less than or equal to zero (i.e. ≦0) and to deliver the reset signal if the response is affirmative, namely if the mathematical product is negative or zero.

Figure 1:
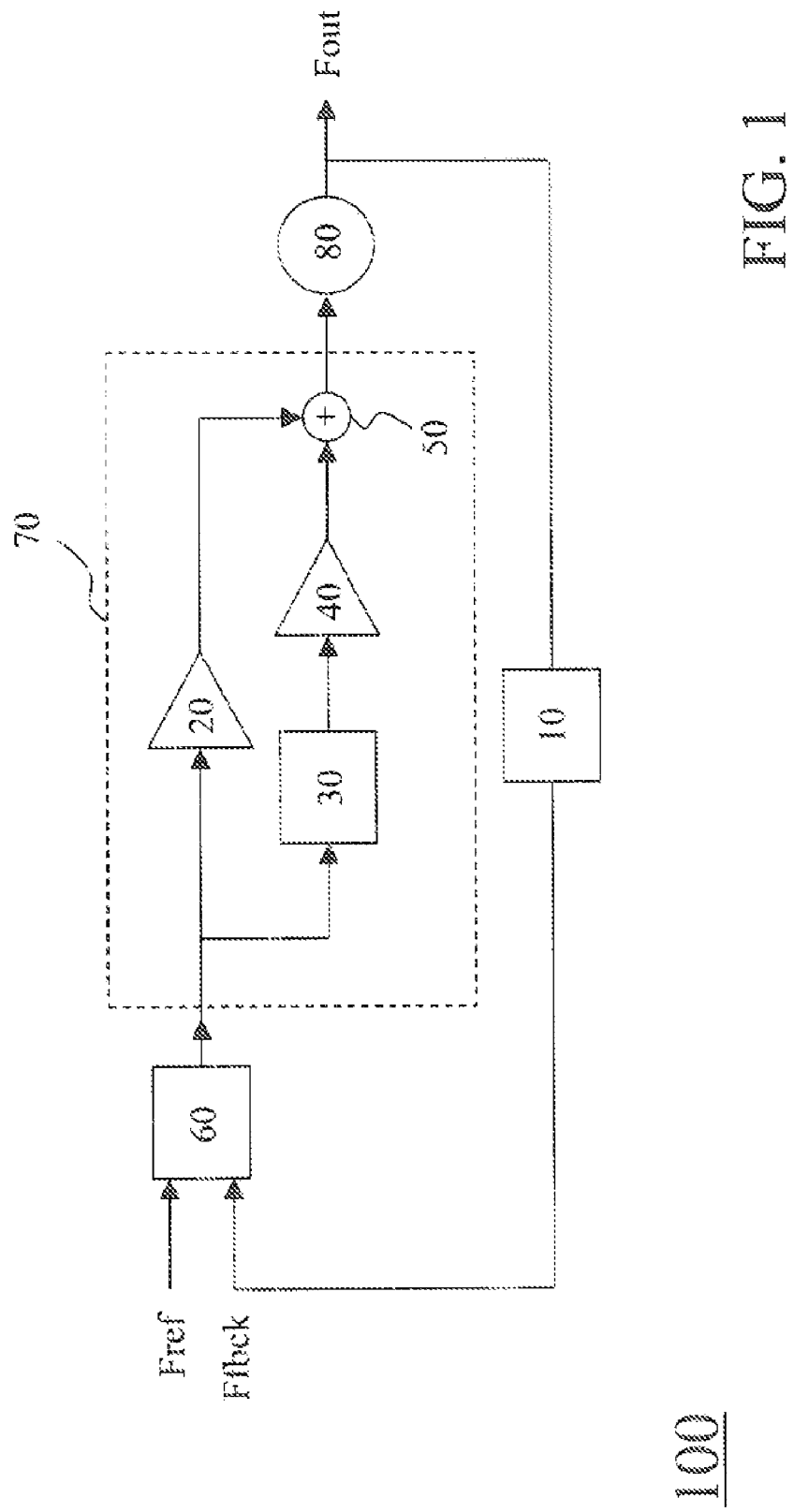
FIG. 1 shows a block diagram of a conventional DPLL.

Application contemplated for such a P2D 60 of FIG. 2 may include a DPLL. In this case, the phase correction level will be related to the DPLL reaction level, which will be increased when the data string length exceeds in absolute value the threshold |DZ|. Several embodiments of a DPLL 300, 400 using the P2D 60 of FIG. 2 may be proposed. In the following, some of them are given only for illustration in FIGS. 5a and 5b, wherein the rest of the elements constitutive of the DPLL 300, 400, i.e. DLF 70, DCO 80 and feedback device 10, are assumed similar to those of FIG. 1.

Figure 5A:
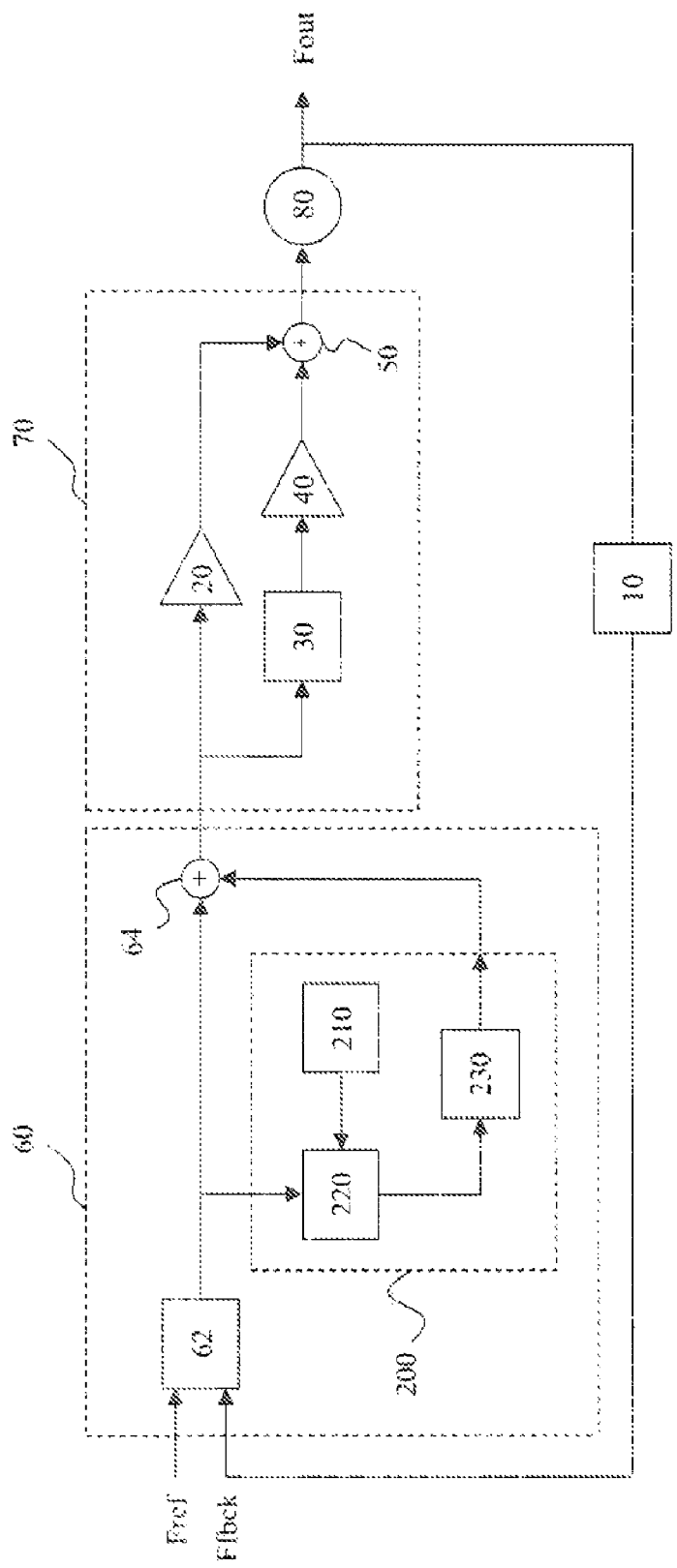
FIG. 5a shows a block diagram of a DPLL using the P2D of FIG. 2.

As depicted in FIG. 5a and also in FIG. 2, the P2D 60 may have one output corresponding to the output of its summer 64, which is identically provided to the respective input of the proportional control path and the integral control path of the DLF 70.

Figure 5B:
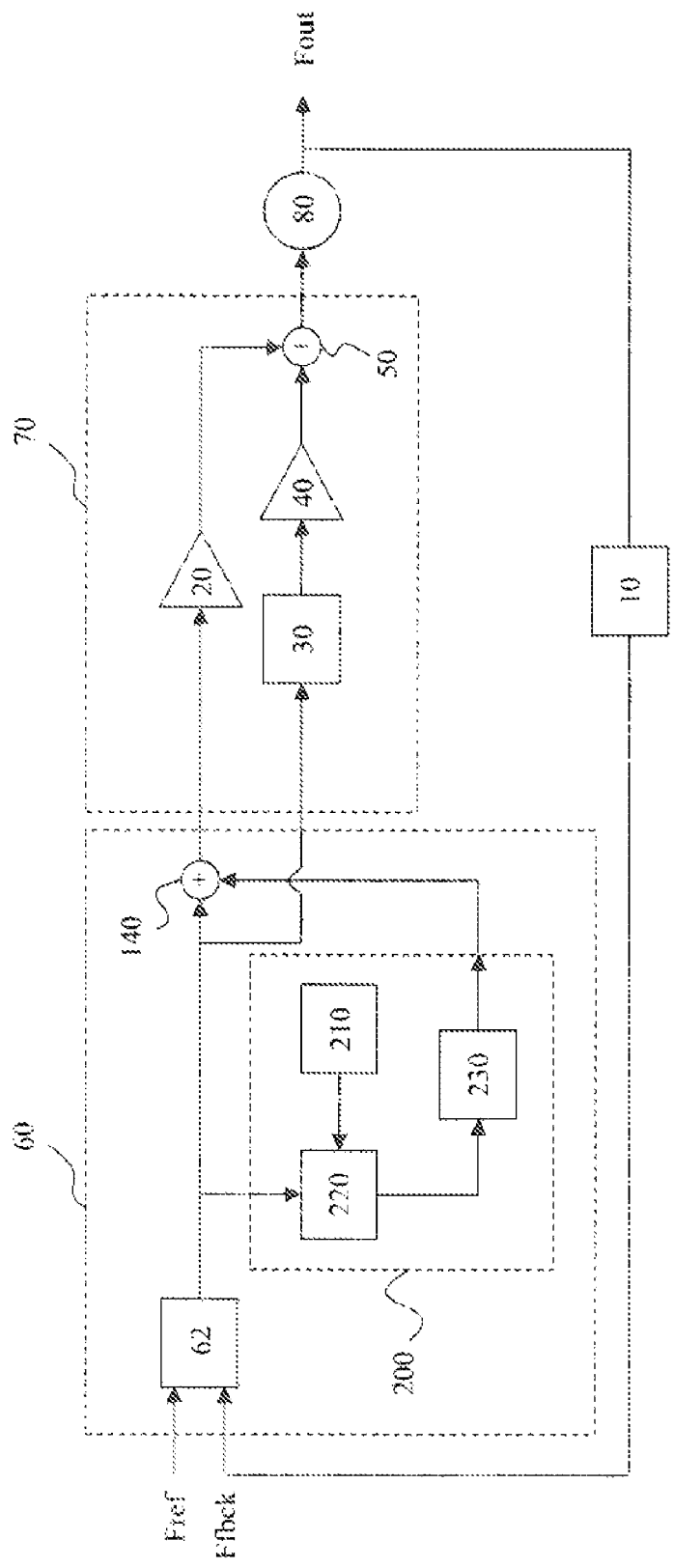
FIG. 5b shows a block diagram of a DPLL using a variant of the P2D of FIG. 2.

As depicted in FIG. 5b, the P2D 60 may also have an additional output, namely two outputs. The first one corresponds to the output of its summer 64, which may be provided to the input of the proportional control path of the DLF 70, and the second one corresponds to the output of the BBPD 62, which may be provided to the input of the integral control path of the DLF 70.

It is to be noted that inserting the counter 220 in the forward path in addition to the already present integrator 30 in the DLF 70 does not mean that the loop filter type number is increased. Indeed, it is still a type-II system due to the fact that the counter 220 is reset every time the BBPD output changes sign, such that it cannot be seen as an integrator under these circumstances.

It is furthermore to be noted that, with respect to a DPLL using merely a stand-alone BBPD 62, the DPLL 300, 400 of the invention speeds up the phase-locking process not only when the DPLL 300, 400 initially needs to achieve lock, but also when the loop loses lock since, in that case, the additional digital circuit 200 in the P2D 60 is automatically activated whenever the BBPD 62 outputs a data string longer than the set threshold.

Figure 6A:
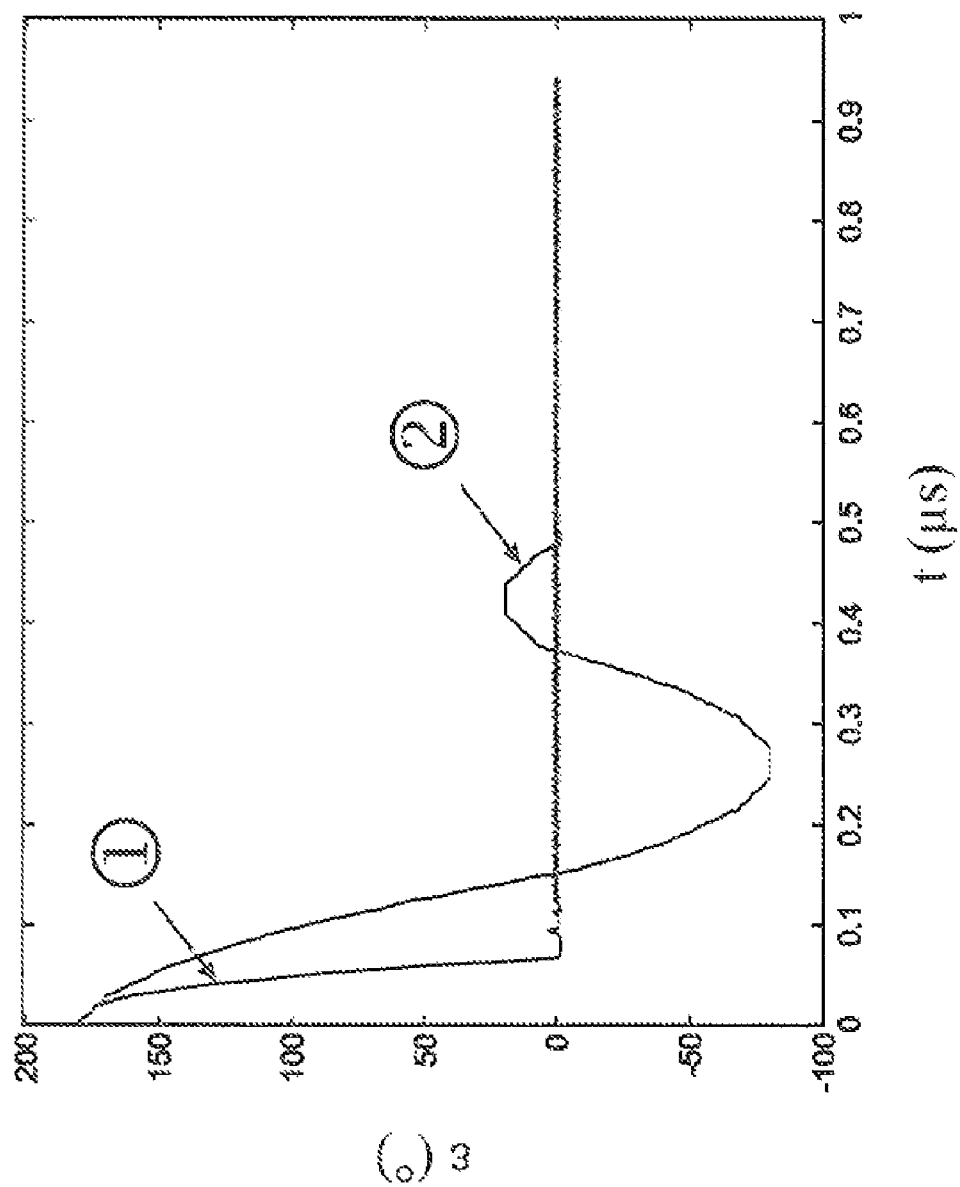
FIG. 6a shows the simulation results for the phase error $\epsilon$ (in degree) as a function of time t (in µs), in both cases that the locking DPLL uses an enhanced BBPD according to an embodiment of the present invention (curve ①) and a mere stand-alone BBPD (curve ②)
Figure 6B:
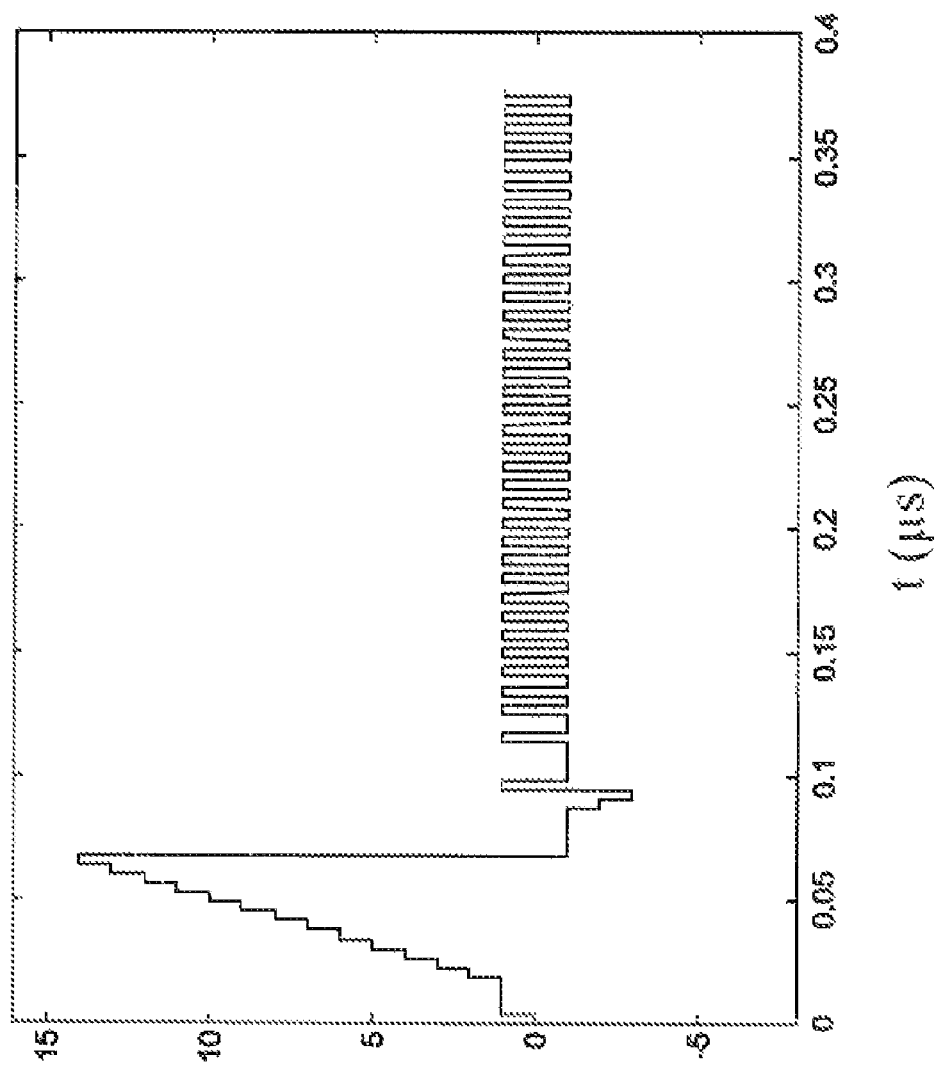
FIG. 6b shows the simulation result for the summer output of the P2D of FIG. 6a corresponding to the symbol ① as a function of time (in µs).

The performance of the present invention is better illustrated through FIGS. 6a and 6b, wherein the curve indicated by the symbol ① corresponds to a locking DPLL using an enhanced BBPD according to an embodiment (two-output P2D 60 of FIG. 5b, additional digital circuit 200 of FIG. 4a, DZ equal to 4, no clipping) of the present invention.

FIG. 6a shows the simulation results for the phase error ε (in degree) as a function of time t (in μs) (initial phase error equal to 180 degrees, frequency error equal to 0 Hertz), wherein the curve indicated by the symbol ② corresponds to a locking DPLL using a mere stand-alone BBPD. In this particular simulation, it can be seen that the lock time has been improved from 475 ns (see curve indicated by the symbol ②) to 70 ns (see curve indicated by the symbol ①).

FIG. 6b shows the simulation result for the summer output of the P2D of FIG. 6a corresponding to the symbol ① as a function of time (in μs).

Applications contemplated for such P2D 60 of the present invention include any integer-N DPLLs 300, 400, wherein fast achievement of phase lock is required. Such DPLLs 300, 400 can be used as frequency generators in many communication devices. In particular, the present invention can be used in WiMedia Ultra Wideband (UWB) systems, wherein DPLL lock speeds for some frequency generator solutions should be extremely high.

In summary, a DPLL 300, 400 having a P2D 60 with an enhanced BBPD has been described. Such a P2D 60 comprises a BBPD 62, an additional digital circuit 200 including a sign detector 210, a counter 220 and a mapping function 230, and a summer block 64. During the locking process, the BBPD 62 may output a repeating value, namely a string of data bits of same polarity value either "+1" or "−1". The polarity sign is detected by the sign detector 210, and the data string length is determined by the counter 220 that is reset to zero whenever the BBPD output changes sign. The mapping function 230 is configured for mapping the data string length in input to the phase correction level in output. Its output is added to that of the BBPD 62 through the summer block 64, such that the phase correction level is increased to enhance the locking process whenever a data string is detected.

While the present invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single or other unit may fulfil the functions of several items recited in the claims. The mere fact that certain measures are recited in mutually different dependent claims does not indicate that a combination of these measured cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Finally, any reference signs in the claims should not be construed as limiting the scope.

The invention claimed is:

1. A circuit for a phase-locking process, said circuit comprising:
   a single-bit phase detector for providing a single-bit data in output, said single-bit data being defined by a polarity;
   a sign detector for detecting a sign of said polarity, said sign detector providing a reset signal when the detected sign changes;
   a counter for measuring a count value corresponding to a number of consecutive single-bit data provided by said single-bit phase detector, said counter being reset to zero after receiving said reset signal;
   a mapping function for performing an input-output mapping, said mapping function being configured for mapping said count value in input to a reaction level of said circuit in output, said reaction level corresponding to a phase correction level; and
   a summer block for summing the output of said mapping function and the output of said single-bit phase detector.

2. The circuit according to claim 1, wherein said circuit has one output, said one output being said output of said summer block.

3. The circuit according to claim 1, wherein said circuit has a first output and a second output, said first output being said output of said summer block and said second output being said output of said single-bit phase detector.

4. The circuit according to claim 1, wherein said sign detector comprises:
   a delay element for delaying said output of said single-bit phase detector by one reference clock period; and
   a first comparator for comparing the delayed output and said output of said single-bit phase detector, said first comparator providing said reset signal as a comparison result when a difference between said delayed output and said output of said single-bit phase detector is detected.

5. The circuit according to claim 1, wherein said sign detector comprises:
   a sign indicator for indicating a sign of said count value; and
   a second comparator for comparing a sign of said output of said single-bit phase detector and said indicated sign, said second comparator providing said reset signal as a comparison result when a difference between said sign of said output of said single-bit phase detector and said indicated sign is detected.

6. The circuit according to claim 1, wherein said sign detector comprises:
   a multiplier for generating a mathematical product of said output of said single-bit phase detector with said count value; and
   a third comparator for determining whether the mathematical product is less than zero, said third comparator providing said reset signal if a response is affirmative.

7. The circuit according to claim 1, wherein said sign detector comprises:
   a multiplier for generating a mathematical product of said output of said single-bit phase detector with said count value; and
   a fourth comparator for determining whether the mathematical product is less than or equal to zero, said fourth comparator providing said reset signal if a response is affirmative.

8. The circuit according to claim 1, wherein said mapping is made by setting a threshold of said count value, said threshold defining a dead zone corresponding to a zero value of said reaction level.

9. The circuit according to claim 1, wherein said mapping is made by setting a maximum value (C) of said reaction level.

10. The circuit according to claim 1, wherein said single-bit phase detector is a bang-bang phase detector (BBPD).

11. A phase-locked loop (PLL), said PLL comprising said circuit as claimed in claim 1.

12. A method for a phase-locking process, said method comprising the steps of:
   providing a single-bit data, said single-bit data being defined by a polarity;
   detecting a sign of said polarity;
   providing a reset signal when the detected sign changes;
   measuring a count value corresponding to a number of consecutive provided single-bit data, said count value being reset to zero after receiving said reset signal;
   performing an input-output mapping by mapping said count value in input to a reaction level in output, said reaction level corresponding to a phase correction level; and
   summing said reaction level and said provided single-bit data.

13. A computer-readable program product comprising:
   a non-transitory storage medium containing program code for causing a computer to carry out the steps of the method as claimed in claim 12 when said computer-readable program product is used by the computer.

14. An integrated circuit comprising a circuit as claimed in claim 1.

15. An integrated circuit comprising a phase-locked loop (PLL) as claimed in claim 11.

* * * * *